United States Patent
Brunton

(10) Patent No.: US 9,130,094 B2
(45) Date of Patent: *Sep. 8, 2015

(54) METHOD AND APPARATUS FOR DIVIDING THIN FILM DEVICE INTO SEPARATE CELLS

(75) Inventor: Adam North Brunton, Oxford (GB)

(73) Assignee: M-SOLV LTD., Oxford (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/825,629

(22) PCT Filed: Sep. 16, 2011

(86) PCT No.: PCT/GB2011/001352
§ 371 (c)(1),
(2), (4) Date: Apr. 18, 2013

(87) PCT Pub. No.: WO2012/038689
PCT Pub. Date: Mar. 29, 2012

(65) Prior Publication Data
US 2013/0210224 A1    Aug. 15, 2013

(30) Foreign Application Priority Data
Sep. 25, 2010  (GB) .................................. 1016172.7

(51) Int. Cl.
*B23K 26/364* (2014.01)
*H01L 31/05* (2014.01)
(Continued)

(52) U.S. Cl.
CPC .......... *H01L 31/0504* (2013.01); *B23K 26/367* (2013.01); *B23K 26/409* (2013.01); *H01L 21/6715* (2013.01); *H01L 21/76879* (2013.01); *H01L 31/0463* (2013.01); *Y02E 10/50* (2013.01)

(58) Field of Classification Search
CPC ............... B23K 26/367; B23K 26/409; H01L 21/6715; H01L 21/76879; H01L 27/1425; H01L 31/0504
See application file for complete search history.

(56) References Cited

U.S. PATENT DOCUMENTS

| | | | |
|---|---|---|---|
| 4,758,526 A | 7/1988 | Thalheimer | 437/2 |
| 6,310,281 B1 | 10/2001 | Wendt et al. | 136/256 |

(Continued)

FOREIGN PATENT DOCUMENTS

| | | |
|---|---|---|
| EP | 2 442 360 A2 | 4/2012 |
| EP | 2 442 361 A2 | 4/2012 |

(Continued)

*Primary Examiner* — Geoffrey S Evans
(74) *Attorney, Agent, or Firm* — Ked & Associates, LLP

(57) ABSTRACT

A method and apparatus for dividing a thin film device having a first layer which is a lower electrode layer, a second layer which is an active layer and a third layer which is an upper electrode layer, the layers each being continuous over the device, into separate cells each having a width W, which are electrically interconnected in series by interconnect structures. The dividing of the cells and the formation of the interconnect structures between adjacent cells are carried out by a process head which is arranged to operate on more than one interconnect structure at a time in a sequence of passes to and fro over the device, the process head performing the following steps: a) making a first cut through the first, second and third layers; b) making a second cut through the second and third layers, the second cut being adjacent to the first cut; c) making a third cut through the third layer the third cut being adjacent to the second cut and on the opposite side of the second cut to the first cut; d) using a first ink jet print head to deposit a non-conducting material into the first cut; and e) using a second ink jet print head to apply conducting material to bridge the non-conducting material in the first cut and either fully or partially fill the second cut such to form an electrical connection between the first layer and the third layer, wherein step (a) precedes step (d), step (d) precedes step (e) and step (b) precedes step (e), (otherwise the steps may be carried out in any order in the single pass of the process head across the device). The thin film device may be a solar panel, a lighting panel or a battery.

23 Claims, 8 Drawing Sheets

(51) Int. Cl.
    *B23K 26/36* (2014.01)
    *B23K 26/40* (2014.01)
    *H01L 21/67* (2006.01)
    *H01L 21/768* (2006.01)
    *H01L 31/0463* (2014.01)

(56) References Cited

U.S. PATENT DOCUMENTS

| | | | |
|---|---|---|---|
| 6,323,056 B1 | 11/2001 | Miyoshi | 438/80 |
| 6,491,361 B1* | 12/2002 | Spann | 219/121.67 |
| 7,902,085 B2* | 3/2011 | Chung et al. | 438/780 |
| 8,470,615 B2 | 6/2013 | Stein | 438/19 |
| 8,785,228 B2* | 7/2014 | Brunton | 438/47 |
| 8,865,569 B2* | 10/2014 | Brunton | 438/463 |
| 2003/0209527 A1 | 11/2003 | Borgeson et al. | 219/121.69 |
| 2003/0213974 A1 | 11/2003 | Armstrong et al. | 257/184 |
| 2007/0068570 A1 | 3/2007 | Kim et al. | 136/256 |
| 2007/0079866 A1* | 4/2007 | Borden et al. | 136/252 |
| 2008/0314439 A1* | 12/2008 | Misra | 438/66 |
| 2009/0007957 A1* | 1/2009 | Borden et al. | 136/244 |
| 2009/0077804 A1* | 3/2009 | Bachrach et al. | 29/890.033 |
| 2009/0324903 A1* | 12/2009 | Rumsby | 219/121.69 |
| 2010/0072181 A1* | 3/2010 | Maschera et al. | 219/121.69 |
| 2010/0170558 A1 | 7/2010 | Stein | 136/244 |
| 2011/0139755 A1* | 6/2011 | Manens et al. | 219/121.67 |
| 2012/0164780 A1* | 6/2012 | Brunton | 438/71 |

FOREIGN PATENT DOCUMENTS

| | | | |
|---|---|---|---|
| GB | 2458986 A | | 10/2009 |
| JP | H10-209475 A | | 8/1998 |
| JP | 11-163499 A | * | 6/1999 |
| JP | 11-274671 A | * | 10/1999 |
| JP | 2003-318133 A | * | 11/2003 |
| WO | WO 2007/044555 A2 | | 4/2007 |
| WO | WO 2008/157807 A2 | | 12/2008 |
| WO | WO 2011/048352 A1 | | 4/2011 |
| WO | WO 2013/045117 A1 | | 4/2013 |

* cited by examiner

METHOD AND APPARATUS FOR DIVIDING THIN FILM DEVICE INTO SEPARATE CELLS

TECHNICAL FIELD

This invention relates to a process of using scribing and ink jet printing techniques for forming separate electrical cells and interconnecting them in series to manufacture various thin film devices. In particular, it describes a novel method for forming the cells and series interconnecting structures in solar panels that have continuous layers of bottom electrode material, semi-conductor material and top electrode material. It is particularly appropriate for solar panels formed on flexible substrates as the process eliminates the problems associated with sequential layer to layer scribe alignment. The method is also appropriate for the manufacture of other thin film devices such as lighting panels and batteries. The invention also relates to apparatus for carrying out the method described.

BACKGROUND ART

The usual way to form and interconnect cells in thin film solar panels involves sequential layer coating and laser scribing processes. To complete the structure three separate coating processes and three separate laser processes are usually required. It is usual to perform these processes in a six step sequence consisting of a laser step following each coating step as described below:

a) Deposit a thin layer of the lower electrode material over the whole substrate surface. The substrate is usually glass but can also be a polymer sheet. This lower layer is often a transparent conducting oxide such as tin oxide ($SnO_2$), zinc oxide (ZnO) or indium tin oxide (ITO). Sometimes it is an opaque metal such as molybdenum (Mo).

b) Laser scribe parallel lines across the panel surface at typically 5-10 mm intervals right through the lower electrode layer to separate the continuous film into electrically isolated cell regions.

c) Deposit the active electricity generating layer over the whole substrate area. This layer might consist of a single amorphous silicon layer or a double layer of amorphous silicon and micro-crystalline silicon. Layers of other semiconducting materials such as cadmium telluride and cadmium sulphide (CdTe/CdS) and copper indium gallium di-selenide (CIGS) are also used.

d) Laser scribe lines through this active layer or layers parallel to and as close as possible to the initial scribes in the first electrode layer without damaging the lower electrode material e) Deposit a third, top electrode layer, often a metal such as aluminium or a transparent conductor such as ZnO, over the whole panel area.

f) Laser scribe lines in this third layer as close to and parallel to the other lines to break the electrical continuity of the top electrode layer.

Generally, it is necessary to move the substrate between different environments (eg a vacuum or atmospheric environment) between each of these steps.

This procedure of deposition followed by laser isolation breaks up the panel into a multiplicity of separate long, narrow cells and causes an electrical series connection to be made between all the cells in the panel. In this way, the voltage generated by the whole panel is given by the product of the potential formed within each cell and the number of cells. Panels are divided up into typically 50-100 cells so that overall panel output voltage is typically in the 50 to 100 Volt range. Each cell is typically 5-15 mm wide and around 1000 mm long. A thorough description of the processes used in this multi-step solar panel manufacturing method is given in JP10209475.

Schemes have been devised to simplify this multi-step process of making solar panels by combining some of the separate layer coating steps. This reduces the number of times the substrate has to be moved from a vacuum to an atmospheric environment and hence is likely to lead to improved layer quality and increased solar panel efficiency. U.S. Pat. No. 6,919,530, U.S. Pat. No. 6,310,281 and US2003/0213974A1 all describe methods for making solar panels where two of the 3 required layers are coated before laser scribing is performed. The lower electrode layer and the active layer (or layers) are deposited sequentially and then both layers are laser scribed together to form a groove that is then filled with an insulating material. For U.S. Pat. No. 6,310,281 and US2003/0213974A1 it is proposed that this groove filling be performed by ink jet printing. Following the groove filling, the interconnection procedure is as described above with a laser scribe through the active layer, deposition of the top electrode layer and a final scribe of the top electrode layer to isolate the cells.

A scheme has also been proposed where all three layers are coated before any laser scribing is performed. WO 2007/044555 A2 describes a method for making a solar panel where the complete three layer stack is coated in one process sequence following which laser scribes are made into and through the stack. The laser scribe process is complex as it consists of a single scribe with two different depths. On a first side of the scribe the laser penetrates the complete three layer stack right through to the substrate in order to electrically separate the lower electrode layer to define the cells while on the second side of the scribe the laser only penetrates through the top and active layers to leave a region where a ledge of lower electrode layer material is exposed. Insulating material is applied locally to the first side of the scribe that penetrates to the substrate so that the insulating material covers the edge of the lower electrode layer and the edge of the active layer on the first side of the scribe. Following this, conducting material is deposited into the scribe so that it bridges the insulating material previously applied and connects the top electrode layer on the first side to the ledge of lower electrode material on the second side.

The process described in WO2007/044555A2 is complex and requires careful control. Debris generated during the second stage of the dual level laser scribe process is likely to deposit on the adjacent top surface of the ledge of lower electrode material leading to poor electrical connection. A high level of control is needed to ensure that the insulating material is placed in exactly the right position on the first side of the scribe and no material is deposited on top of the ledge of lower electrode material. Extreme accuracy is needed to ensure that the conducting material is placed correctly and does not contact the top electrode on the second side of the scribe. For all these reasons it is unlikely that cell connections can be made with high reliability by this method.

Hence, there remains a requirement for a new cell formation and interconnection process for solar panels and the like that starts with the full stack of three layers but proceeds to make the cell interconnections in a way that is fast, simple and reliable.

Such a process will also be applicable to the formation and series interconnection of cells for the manufacture of other thin film devices such as lighting panels or batteries. Like solar panels, such devices consist of a lower electrode layer, an active layer and a top electrode layer all deposited on a rigid or flexible substrate. Operation at voltages higher than the fundamental single cell voltage can be achieved by dividing the device into multiple cells and connecting the cells in series. The laser and ink jet cell formation and interconnection apparatus proposed here is suitable for such an operation.

For lighting panels, the upper and lower electrodes are likely to be of similar materials to those used for solar panels (eg TCOs or metals) but the active materials are very different. In this case, active layers are most likely to be organic materials but inorganic materials are also possible. Active organic layers are either based on low molecular weight materials (so called OLEDs) or high molecular weight polymers (so called P-OLEDs). Hole and electron transport layers are usually associated with the active light emitting layers. For these lighting panels, operation is at low voltage and all layers are thin and hence the interconnection process described herein is ideal for dividing the panel into cells and connecting these in series to allow operation at a substantially higher voltage For thin film batteries the layers are often more complex. For the case of a thin film battery based on Lithium ion technology, the lower layer has two components—a metal layer for current collection and a Lithium Cobalt Oxide (LiCoO3) layer that functions as a cathode. The upper layer also has two components—a metal layer for current collection and a Tin Nitride (Sn3N4) layer that functions as an anode. In between these two layers is the active layer—a Lithium Phosphorous OxyNitride (LiPON) electrolyte. For such batteries, operation is at low voltage and all layers are thin and hence the interconnection process described herein is ideal for dividing the battery into cells and connecting these in series to allow operation at a substantially higher voltage The applicant has in an earlier (unpublished) patent application proposed a method and apparatus for dividing a thin film solar panel into separate cells and connecting these cells electrically in series. The apparatus used a process head that combines three laser beams and two fluid nozzles. All five of these components on the process head addresses a single interconnect structure between two adjacent cells so that a single passage of the head across the solar panel creates a single interconnect structure. Other interconnect structures are then formed by stepping the process head by distances equal to the cell width, or multiples of the cell width, in the direction perpendicular to the interconnect direction and traversing the process head across the panel again. The present invention provides an improvement of the method and apparatus proposed in the earlier application.

SUMMARY OF THE INVENTION

According to a first aspect of the invention, there is provided a method for dividing a thin film device having a first layer which is a lower electrode layer, a second layer which is an active layer and a third layer which is an upper electrode layer, all the layers being continuous over the device, into separate cells which are electrically interconnected in series by interconnect structures, the dividing of the cells and the formation of interconnect structures between adjacent cells being carried out by a process head which is arranged to be able to operate on more than one interconnect at a time and to perform the following steps, in the formation of each interconnect structure, in a sequence of passes to and fro over the device:

a) making a first cut through the first, second and third layers;
b) making a second cut through the second and third layers, the second cut being adjacent to the first cut;
c) making a third cut through the third layer, the third cut being adjacent to the second cut and on the opposite side of the second cut to the first cut;
d) using a first ink jet print head to deposit a non-conducting material into the first cut; and
e) using a second ink jet print head to apply conducting material to bridge the non-conducting material in the first cut and either fully or partially fill the second cut such that an electrical connection is made between the first layer and the third layer, wherein, step (a) precedes step (d), step (d) precedes step (e) and step (b) precedes step (e) (otherwise the steps may be carried out in any order) and, wherein, during at least one pass of the process head over the device, at least two of said steps are carried out, each on separate interconnect structures.

According to a second aspect of the invention, there is provided apparatus for dividing a thin film device having a first layer which is a lower electrode layer, a second layer which is an active layer and a third layer which is an upper electrode layer, all the layers being continuous over the device, into separate cells each having a width W, which are electrically interconnected in series by interconnect structures, so that adjacent interconnect structures are spaced from each other by the distance W, the apparatus comprising a process head on which are provided:

a) one or more cutter units for making a first cut though the first, second and third layers, a second cut though the second and third layers adjacent to the first cut and a third cut through the third layer adjacent to the second cut and on the opposite side of the second cut to the first cut;
b) a first ink jet print head for depositing a non-conducting material into the first cut; and
c) a second ink jet print head for applying conducting material to bridge the non-conducting material in the first cut and either fully or partially fill the second cut so that an electrical connection is made between the first layer and the third layer, said one or more cutters and said first and second ink jet heads being spaced apart from each other by the distance W (or multiples thereof) whereby the process head can operate on more than one interconnect structure at a time, the apparatus also comprising:
d) drive means for moving the process head relative to the device; and
e) control means for controlling movement of the process head relative to the device and actuating said one or more cutter units and said first and second ink jet print heads so that division of the device into separate cells and the formation of the interconnect structures can be carried out in a sequence of passes of the process head to and fro over the device.

Thus, in the present invention, the three laser beams and two fluid nozzles on the process head are positioned so that they operate on more than one interconnection structure at a time. Cells are typically 5 to 10 mm wide so the laser beams and fluid nozzles are separated by this distance or multiples of this distance. Formation of a complete interconnect structure with all three laser processes and two ink jet processes requires the passage of the process head across the panel several times (rather than a single pass as in the earlier application). Only when all three laser processes and both ink jet processes have been performed on each individual interconnect structure is it complete.

A significant advantage of this invention compared to the earlier application is that the process head can operate in either direction of travel over the panel while still retaining a simple arrangement of laser beams and fluid nozzles. The earlier application mentions the possibility of two-way operation but this requires two sets of fluid nozzles, one set being operational in one direction of travel of the process head and the other in the opposite direction of travel. The present invention avoids the need for this duplication.

Preferred and optional features of the invention will be apparent from the description of the illustrated embodiments and the subsidiary claims of the specification.

The terms 'scribing' and 'cutting' are used interchangeably herein. In the detailed description of the invention that follows the cutter units that are used to form the cuts through the various layers are all based on lasers, the beams from which are focussed to ablate and remove material to form the isolating cuts (ie laser scribing). This is the preferred method for forming the cuts but other methods of cutting may also be used. An alternative method for forming cuts is mechanical scribing with fine wires or styli. Such mechanical scribing can be used instead of laser scribing or cutting for forming all or some of the first, second or third cuts.

Like the invention described in WO 2007/044555 A2, this invention involves the processing of a thin film device having a complete stack of three layers but subsequent layer cutting and ink jet processing is less complex and much more robust compared to that described in WO 2007/044555 A2. As in WO2007/044555 A2, all three coatings are applied sequentially before any layer cutting or material deposition by ink jetting. Ideally, these coatings might be applied in a single vacuum process but this is not essential. A key point of the invention is that following the deposition of the coatings a single combined layer cutting and ink jet process is used to make the cell inter-connections. A "single combined process" should be understood to mean that all the cutting processes and all the associated ink jet based material deposition processes are performed by means of the movement of a process head in a sequence of passes across all or part of the solar panel in a plane parallel to the substrate surface and in a direction parallel to the boundary between the cells. All cutter units and all ink jet print heads required to make one or more cell interconnections are attached to a single process head and hence all items move together at the same speed across the panel.

The sequence in which the various layer cutting processes and the various ink jet deposition processes are applied to the substrate can vary depending on the materials used. The various layer cutter units and ink jet print heads are attached to the process head in positions such that the desired sequence is achieved as the process head moves in a sequence of passes over the substrate.

For simplicity of illustration, the layer cutting processes will henceforth be described with reference to laser ablation. It should be noted, however, that all or some of these laser cutting or laser scribing processes may be replaced by a mechanical scribing process (or other cutting process) as mentioned above.

To form a single cell interconnection structure between adjacent first and second cells, three adjacent laser beams, delivered by three adjacent beam delivery units attached to the process head are moved together with respect to the substrate in a direction parallel to the boundary between the cells to make three parallel adjacent scribes to different depths in the various layers. A first laser beam makes a first scribe line that defines the edge of the first cell. This first scribe penetrates all layers down to the substrate. A second laser beam located on the second cell side of the first scribe makes a second scribe line that penetrates through all layers except the lower electrode layer. A third laser beam situated on the second cell side of the second scribe makes a third scribe that penetrates the upper electrode layer. The third scribe only needs to penetrate the third layer but, in practice, it may also extend partially, or completely, through the second layer (so may be similar in depth to the second scribe). This third scribe defines the extent of the second cell. The precise order in which these three laser processes is performed is not critical but preferred orders are discussed below.

A first ink jet printing process follows some or all of the laser processes. For this first printing process a first ink jet head moves across the substrate surface with at least one nozzle arranged to print a fine line of insulating ink that fills the first laser scribe. This ink can be of the thermally curing type in which case heat is applied locally to the deposited liquid immediately after deposition to cure the insulating ink to make an insulating solid line of material that fills the first scribe. Alternatively following all laser and ink jet processes heat can be applied to the whole of the substrate to cure the lines of insulating ink to make insulating solid lines of material that fill all the first scribes on the substrate. This whole substrate curing process can take place on the same apparatus that performs the laser scribing and ink deposition processes but in practice it is more likely that this curing is performed on separate apparatus.

The insulating ink can also be of the UV curing type. In this case curing is performed by means of a UV lamp or other appropriate UV light source in which case UV radiation is applied locally to the deposited liquid immediately after deposition to cure the insulating ink to make an insulating solid line of material that fills the first scribe. The depth of the insulating layer in the scribe is a small as possible consistent with being continuous and having no pinholes. The width of the line of insulating material is such that it fully contacts the lower two exposed layers on the first cell side of the first scribe so that these layers are protected from material subsequently applied in a second ink jet printing process. Some degree of insulating ink overfilling on both sides of the first scribe is allowed and may even be desirable but ideally the lateral extent of the over filling should be kept to a value that is less than the width of the first scribe.

The second ink jet printing process takes place following some or all of the laser processes and following the first ink jet printing process. For this second ink jet printing process a second ink jet head is moved over the substrate surface with at least one nozzle arranged to print a band of conducting ink that is wide enough to make electrical contact with the top electrode material on the first cell side of the first laser scribe, to straddle the insulating ink material in the first scribe and enter the second scribe to make electrical contact the lower electrode layer material of the second cell. The insulating ink in the first scribe may be either cured or uncured at the time of application of the conducting ink. If the insulating ink is uncured then the composition of the conducting ink is such that the solvent does not significantly perturb or dissolve the uncured insulating ink material. The conducting ink is likely to be of the thermally curing type, in which case, following all laser and ink jet processes, heat is applied to the whole substrate to cure the bands of conducting ink to form solid conducting bands of material. In this way electrically conducting bridges are formed that connect the top electrode in one cell to the lower electrode layer in the next cell. The depth of the conducting layer is as small as possible consistent with being robust and having adequately low electrical resistance. The width of the line of conducting material is such that it fully contacts a region of the first cell top electrode material on the first cell side of the first scribe and fully fills the second scribe. Some degree of conducting ink overfilling on the first cell side of the first scribe and the second cell side of the second scribe is allowed and may even be desirable but ideally the lateral extent of the over filling should be kept to a value less than the scribe width.

Because three separated laser scribes are used it is possible to individually optimize the laser process parameters for each scribe to eliminate the possibility of substrate or lower layer damage, reduce risk of forming electrical shorts between layers and minimize debris deposition.

It is possible to attach the individual beam delivery heads to the process head in spaced apart positions perpendicular to the direction of movement of the head (or at an angle thereto) so the positions of the ink jet heads defines the sequence in which processes are applied to the substrate in the sequence of passes of the process head over the substrate. A preferred sequence for the five processes is:

a. First laser scribe through all layers down to the substrate surface to define the extent of the first cell
b. First ink jet process to deposit insulating ink in the first laser scribe
c. Second laser scribe process through the top two layers down to the lower electrode layer
d. Second ink jet process to apply a band of conducting ink over the insulating ink to form a conducting bridge from the top electrode on the first cell side to the lower electrode on the second cell side
e. Third laser scribe process through the top electrode layer to isolate the first and second cells and define the extent of the second cell. As indicated above, this third scribe can also extend partially or completely through the second layer but should not penetrate the first layer, With this sequence of laser and ink jet processes, lower layers in the stack remain protected from laser ablation debris and stray ink materials arising from earlier processes until just before exposure and the total cell interconnection process becomes very robust.

For example, some debris generated by the first laser process and some insulating ink deposited by the first printing process may form on the substrate surface in the region where the second laser process scribes through to expose the lower electrode. If the second laser process precedes the first ink jet printing process, or the first laser process, then any stray debris or insulating ink may enter the second laser scribe region and contaminate the exposed lower electrode layer. Leaving the second laser process until after both the first laser and first ink jet printing processes means that the lower electrode layer in the area of the second laser scribe remains protected and during the second laser process any re-deposited debris and any insulating ink in that area is removed as the laser ablates the top two layers.

As another example, debris generated by the second laser process and some conducting ink deposited by the second printing process may form on the substrate surface in the region where the third laser process scribes through to separate the top electrode layer. If the third laser process precedes the second printing or the second or even first laser processes then any stray debris or ink may deposit on the top surface of the second cell in the third laser scribe region and may cause an electrical connection across the scribe region. Leaving the third laser scribe process until after both the first and second laser processes and after both the first and second printing processes means that this source of interconnect failure is eliminated.

Some processes have to precede others:
1) The first laser scribe process must always precede the first printing process
2) The first printing process must always precede the second printing process
3) The second laser scribe process must always precede the second printing process.

Within these rules several different process sequences are possible but the one given above is preferred.

There are two ways to cure the dielectric inks—thermally or by UV. The conducting ink is usually thermally cured. If both inks can be thermally cured, and the uncured dielectric ink does not mix with the conducting ink when that is applied, the whole curing process can be done separately be after the cutting and deposition steps. In this case, no curing devices are needed on the process head. However, in many cases, it will be desirable to cure (either thermally or by UV) the dielectric ink before the conducting ink is deposited. In this case, a curing device is needed on the process head. If the dielectric ink is UV cured it is likely that it will be necessary to cure this before the conducting ink is applied as the conducting ink is, in many cases, opaque.

The lasers used to create the first, second and third cuts are generally of the pulsed Q-switched type operating in the IR to UV range (ie with wavelengths from 1080 nm down to 340 nm). It is also possible to use lasers that operate at shorter wavelength, eg down to 250 nm. In the simplest case, a single laser is used with a single focussing lens to create all three cuts associated with a single interconnect structure. Hence, in this case, it is necessary to divide the single beam into three components to form three focal spots on the substrate surface. Cut separation in an interconnect is generally small (in the 0.1 to 0.2 mm range) so a preferred way to make the three-way beam division is to use a diffractive optical element (DOE) or special multi-facetted prismatic element positioned before a single focussing lens. Such devices introduce small angular deviations to parts of the laser beam which give rise to focal spot separations of the required value at the focus of the lens. Such devices also allow the relative power in individual beams to be set by suitable device design.

Another preferred method to create the first, second and third beams associated with a single interconnect structure involves the use of two different pulsed lasers and a single focussing lens. In this case, the lasers can have different wavelengths which is often advantageous in terms of optimised removal of upper layers without damaging lower layers of material. When two lasers are used to form the three beams required for a single interconnect structure, a first laser is used to form two of the beams and the second laser the third beam. A DOE or simple biprism is used to divide the first beam into two components in the same way as discussed above for the case where only a single laser is used and the beam is divided into three components. The beam from the second laser is combined with the beams created from the first laser and all beams are passed through a single focussing lens to create three spots with the required separation on the substrate surface. Beam combining with a special mirror that transmits one beam and reflects another using polarisation or wavelength differences between first and second lasers is commonly used. For the case where first, second and third scribes are performed on separated interconnects, a separate lens may be used for each scribe.

Servo motor driven stages are used to move the substrate with respect to the process head. In operation, the process head can be stationary with the panel moving in two axes in a series of linear moves in the direction parallel to the cell directions each pass across the substrate being followed by a step in the orthogonal direction. Other stage arrangements are possible. A preferred arrangement has the substrate moving in one axis and the process head moving in the other. An arrangement where the process head moves in two orthogonal axes over a stationary substrate is also possible.

Other preferred and optional features of the invention will be apparent from the subsidiary claims of the specification.

BRIEF DESCRIPTION OF DRAWINGS

The invention will now be described, merely by way of example, with reference to the accompanying drawings, in which.

For simplicity, the figures illustrate layer cutting processes as being of the laser ablation type. However, as indicated above, all or some of these laser cutting processes may be replaced by a mechanical scribing process or other cutting process.

DETAILED DESCRIPTION OF DRAWINGS

Figure 1:
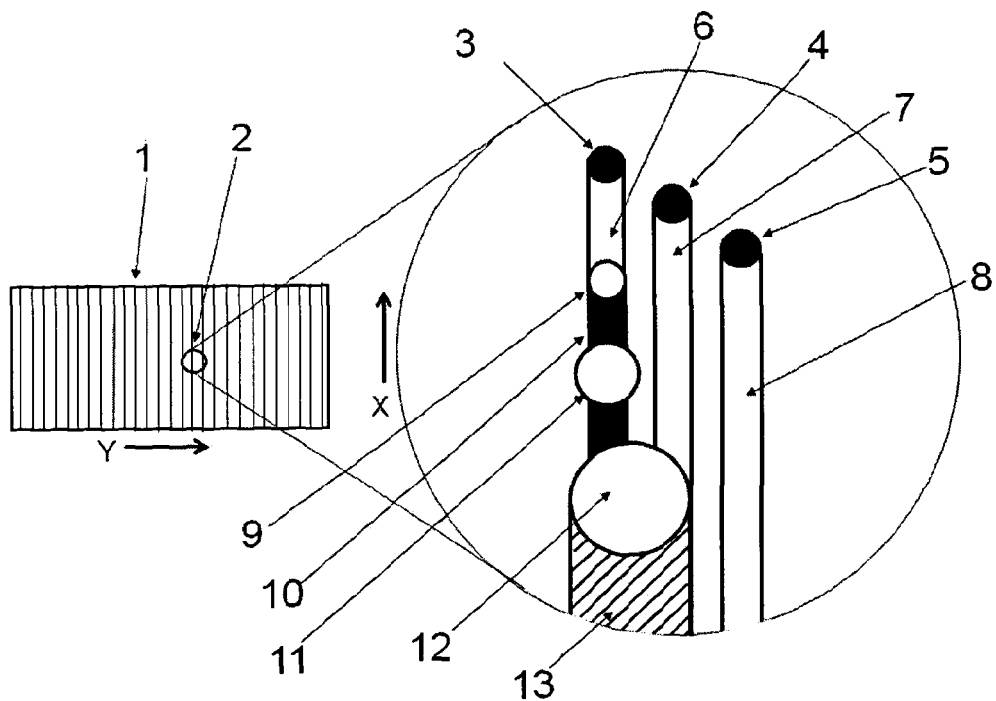
FIG. 1 shows an enlarged, schematic, plan view of part of apparatus according to the applicant's earlier (unpublished) application.

FIG. 1: This shows the details of the basic process head as proposed in the earlier (unpublished) application referred to above. A solar panel 1 is divided into a plurality of cells along its Y direction by means of a process head 2 that moves across it in the X direction. The enlarged diagram of the process head shows the three laser beams 3, 4 and 5 that scribe grooves 6, 7 and 8, respectively, through the thin film layers on the solar panel. Nozzle 9 applies liquid insulating ink 10 into scribe 6. This ink needs to be cured and this is done either thermally or by UV activation. Device 11 represents either a local heating source such as an IR lamp, IR diode laser or other IR laser device or a local UV source such as a UV lamp, UV laser diode or light guide delivering UV radiation to the panel surface. Nozzle 12 applies conducting ink 13 to bridge over the insulating ink 10 filling laser scribe 6 and entering laser scribe 7. All laser beams and both nozzles move together in the X direction across the panel to make a complete a single interconnect structure in a single pass. After the passage of the head across the panel, the panel (or head) is stepped in the Y direction by a cell width to process the adjacent interconnect. As the insulating ink 10 cannot be applied until the laser groove 6 has been formed and the conducting ink 13 cannot be applied until after the insulating ink has been applied and cured, it is readily seen that the head arrangement shown can only operate in one direction.

Figure 2:
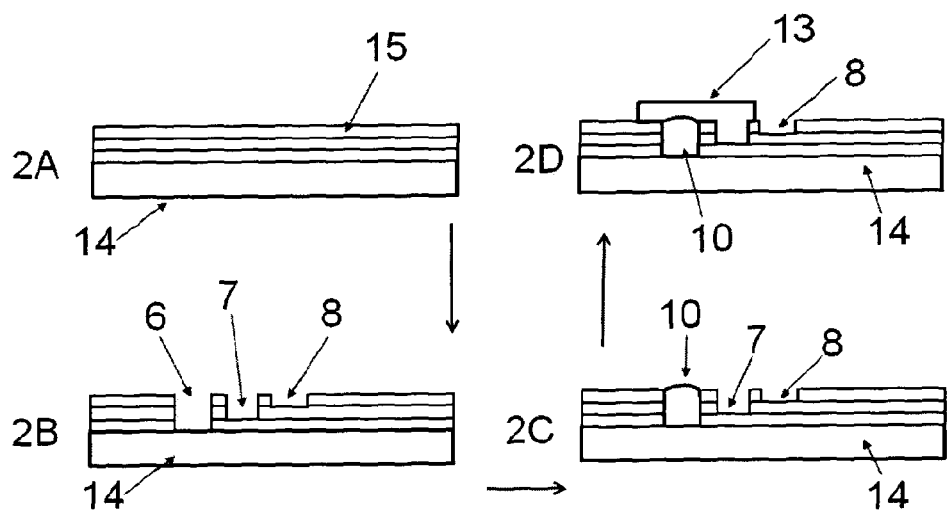
FIGS. 2A to 2D show a preferred sequence of laser and ink jet processes delivered to a substrate surface by the apparatus shown in FIG. 1.

FIG. 2: This shows the sequence in which structures are formed in the panel surface by the type of head arrangement shown in FIG. 1. Substrate 14 has a stack of 3 layers 15 applied to the surface as shown in FIG. 2A. In simple terms, these layers are the lower electrode layer, the active layer and the upper electrode. The passage of the three laser beams 3, 4 and 5 across the panel create the 3 scribes 6, 7 and 8 as shown in FIG. 2B; where scribe 6 penetrates all layers as far as the substrate surface, scribe 7 penetrates through the two top layers only as far the lower electrode layer and scribe 8 penetrates through at least the top electrode layer but may also penetrate the middle layer as for scribe 7. FIG. 2C shows how $1^{st}$ ink jet nozzle 9 applies insulating ink 10 to fill scribe 6 while FIG. 2D shows how conducting ink 13 is applied by $2^{nd}$ ink jet nozzle 12 to bridge over the insulating ink and enter scribe 7 to make an electrical connection from the upper electrode layer on the cell to the left of scribe 6 to the lower electrode layer at the bottom of scribe 7 in the cell to the right of scribe 6.

Figure 3:
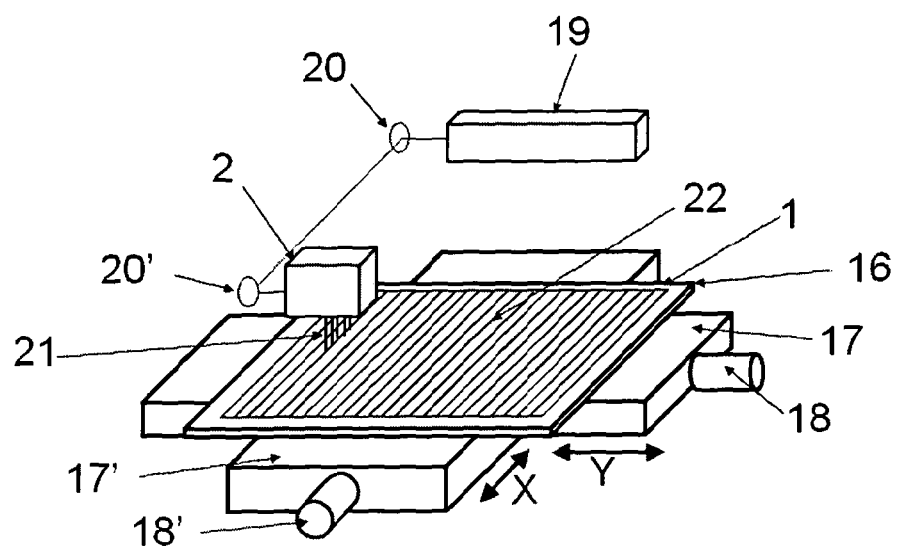
FIG. 3 shows apparatus for moving a substrate in two directions with respect to the process head of FIG. 1.

FIG. 3: This shows one possible arrangement for moving the process head described above with respect to the solar panel. Panel 1 is supported on a process chuck 16 which is moved in the Y direction by linear stage 17 driven by servo-motor 18 and in the X direction by linear stage 17' driven by servo-motor 18'. The beam from laser 19 is directed by mirrors 20, 20' to process head 2 where it is divided into three components to create the three scribes 6, 7 and 8. Process head 2 also contains two ink jet nozzles. All five components are arranged in a line 21 along the X direction to process a single cell interconnect structure 22 as the panel is moved under the process head in the X direction. For each cell interconnection, the panel has to move under the process head in the same direction so that the sequence of scribes and ink applications is correct. Hence, at each panel step in Y the panel has to be moved back to the same starting point in the X direction.

Figure 4:
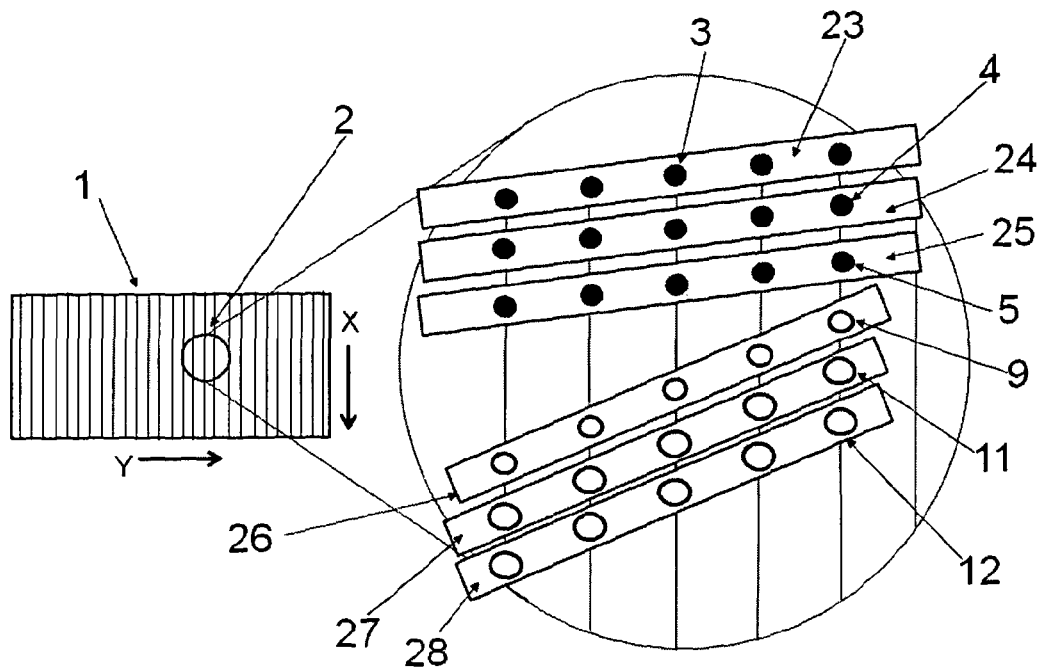
FIG. 4 shows an enlarged, schematic, plan view of a further modified form of the apparatus shown in FIG. 1.

FIG. 4: This shows how several interconnects can be formed at the same time in a single passage over the panel 1 of a modified form of the process head 2 described above. This is achieved by using a frame 23 that delivers a plurality of (five in the example shown) laser beams of type 3 to form a plurality of scribes of type 6 where the angle of the frame 23 is adjusted so that the distance in the Y direction between laser beams 3 is exactly equal to the cell pitch (or a multiple of the cell pitch).

Frame 24 carries a plurality of laser beams of type 4 to form a plurality of scribes of type 7 while frame 25 carries a plurality of laser beams of type 5 to form scribes of type 8. Frame 26 carries a plurality of insulating ink dispensing nozzles 9, frame 27 carries a plurality of ink curing devices 11 and frame 28 carries a plurality of conducting ink dispensing nozzles 12.

The relative positions of the different frames 23, 24, 25 are set in the Y direction and the frames are all rotated about an axis perpendicular to the panel surface such that all three laser grooves 6, 7 and 8 and ink streams 10 and 13 are positioned correctly for each interconnect. Hence, after passage of the process head across the panel a plurality (5 in this example) of complete cell interconnects are formed. The substrate then steps in the Y direction by the required number of multiples of the cell width so that further interconnects can be formed. Because of the arrangement of components on the head, it will be seen that processing is possible in only one direction of movement of the processing head relative to the panel.

Figure 5:
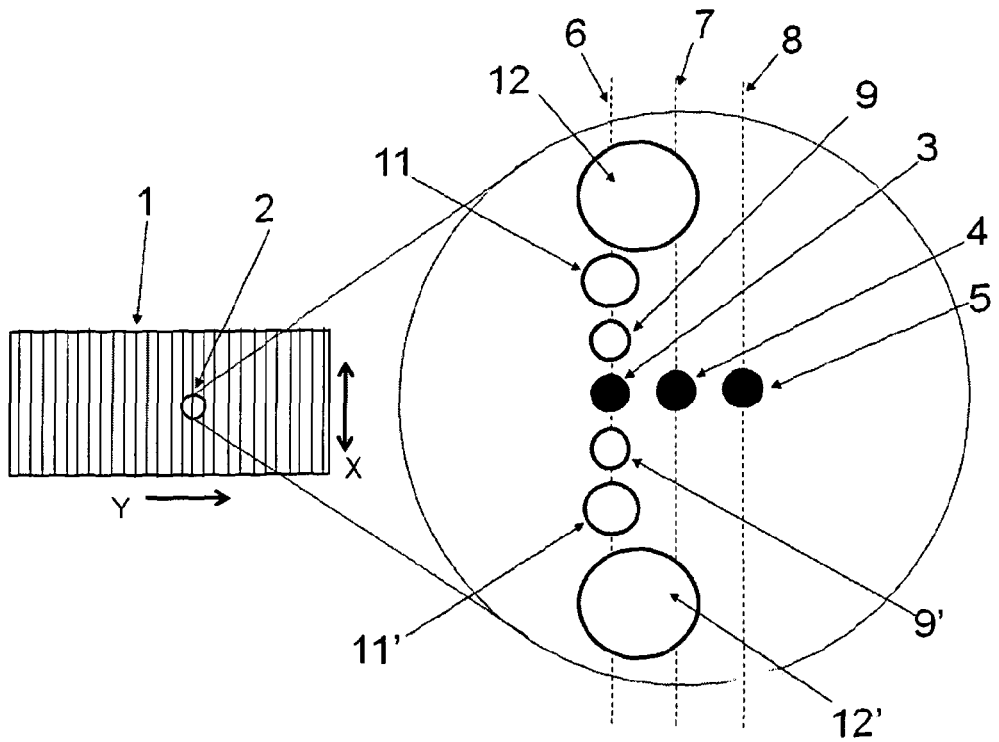
FIG. 5 shows an enlarged, schematic, plan view of a modified form of the apparatus shown in FIG. 1.

FIG. 5: This shows a further modified version of the process head shown in FIG. 1 which allows bi-directional processing of a single interconnect. In this case, additional nozzles and ink curing devices are required as shown. Insulating ink dispensing nozzle 9, ink curing device 11 and conducting ink dispensing nozzle 12 function when the process head is stationary and the panel is moved in the direction towards the top of the figure whereas insulating ink dispensing nozzle 9', ink curing device 11' and conducting ink dispensing nozzle 12' function only when the process head is stationary and the panel is moved in the direction towards the bottom of the figure. Such an arrangement is complex and inefficient as only half the ink jet nozzles and curing devices are in use at any time.

Figure 6:
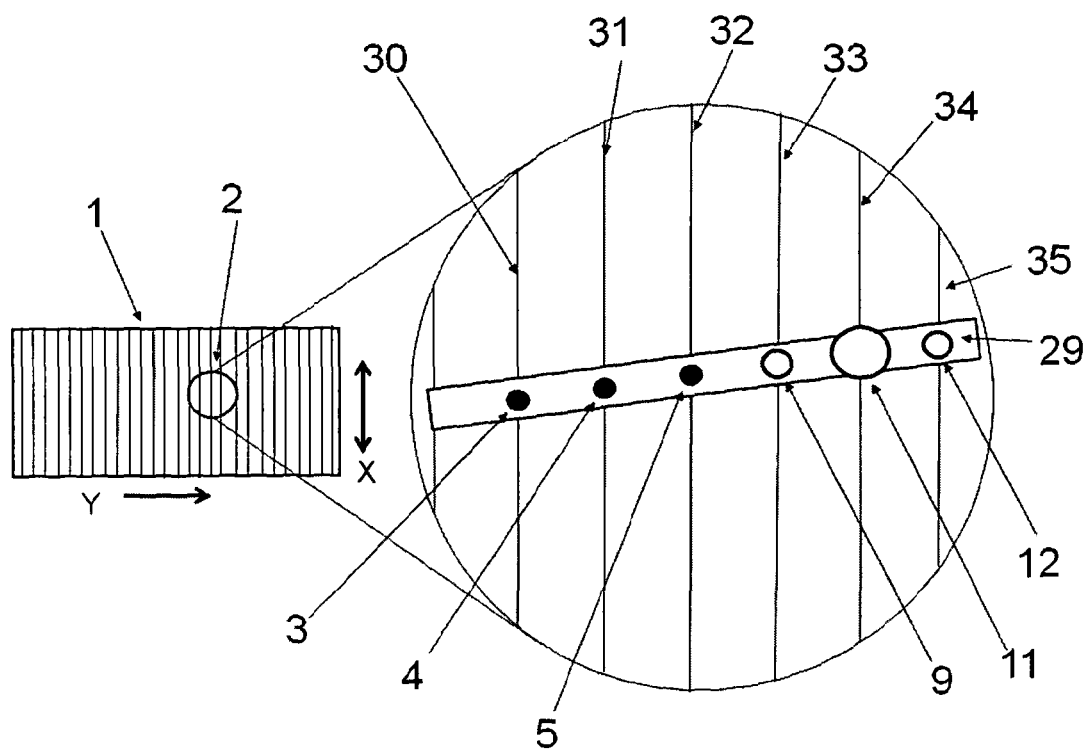
FIGS. 6-11 show enlarged, schematic, plan views of first, second, third, fourth, fifth and sixth embodiments of apparatus according to the invention.

FIG. 6: This shows a processing head according to a first embodiment of the present invention. Frame 29 now carries three laser heads 3, 4 and 5, two ink jet nozzles 9 and 12 and an ink curing device 11 arranged at spaced apart positions such that each component addresses a separate interconnect structure.

The 6 separate components are located on the frame 29 on a pitch equal to the width of the cells in an order given by the sequence in which the various laser and ink filling (and curing) processes are to be performed. The panel 1 moves in the X direction such that the head 2 covers the full width of the panel and after each X pass, in either X direction, the panel 1 is stepped by one cell width in the Y direction (to the right in the figure). By this means, each interconnect location is sequentially processed by each of the components on the head 2. In the figure, as the head moves across the panel in the X direction, laser head 3 addresses an area of panel that has not been processed and scribes through all 3 layers to form groove 6 in interconnect 30. At the same time, laser head 4 scribes through the top 2 layers to form groove 7 in interconnect 31 which has already been processed by laser head 3, laser head 5 scribes through the top layer to form groove 8 in interconnect 32 which has already been processed by laser heads 3 and 4, ink dispensing nozzle 9 deposits insulating ink into groove 6 already formed by laser head 1 on interconnect 33, ink curing device 11 cures the insulating ink associated with interconnect 34 previously deposited by nozzle 9 and, finally, ink dispensing nozzle 12 deposits conducting ink onto interconnect 35 to bridge over the previously deposited insulating ink and to enter the laser groove 7 previously scribed by laser head 4.

In this way, after the panel has been stepped six times by one cell width in the Y direction, the interconnect forming cycle is complete and discrete cells with interconnections therebetween are formed.

Figure 7:
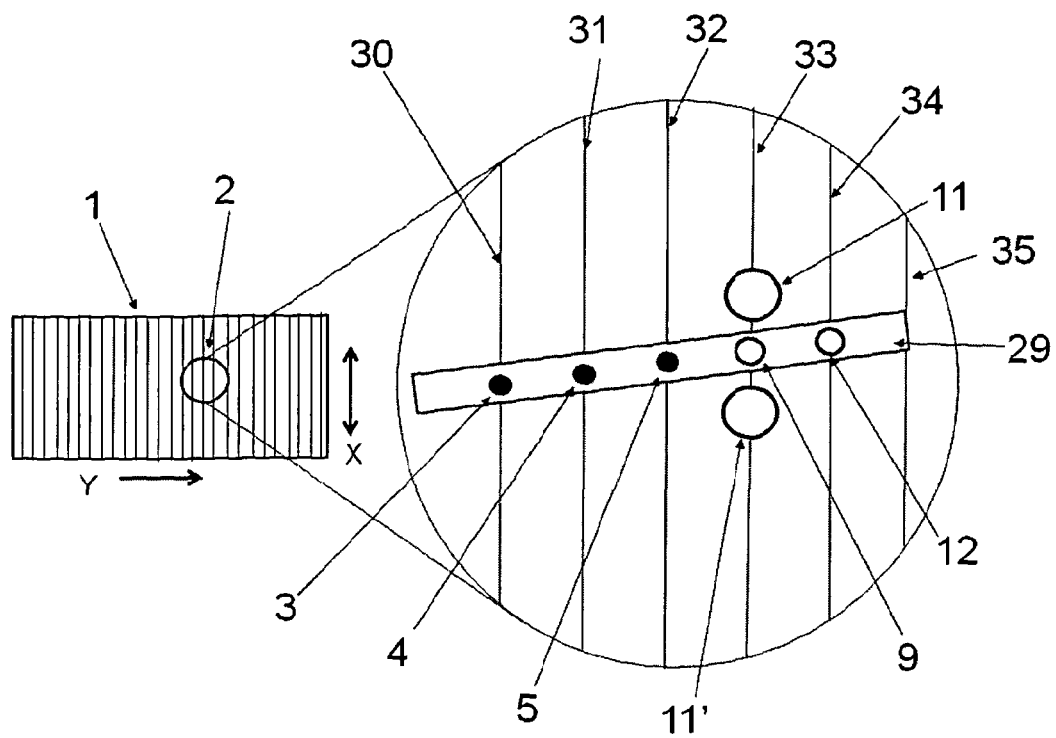

FIG. 7: In the arrangement shown in FIG. 6 the curing of the insulating ink applied by nozzle 9 does not occur immediately and has to wait until the panel has made one step in the Y direction. This time delay may amount to one or more seconds which may be too long for certain inks which may require rapid curing to prevent or limit lateral spreading. FIG. 7 shows an alternative arrangement of the components on the process head that is used if it is necessary to cure the insulating ink applied by nozzle 9 immediately after it is dispensed into groove 6.

In this case, it is necessary to position two curing devices 11 and 11' adjacent to nozzle 9 on the head. Curing device 11 cures insulating ink laid down by nozzle 9 as the panel moves in the Y direction towards the top of the figure. Curing device 11' cures insulating ink laid down by nozzle 9 as the panel moves in the opposite Y direction.

Figure 8:
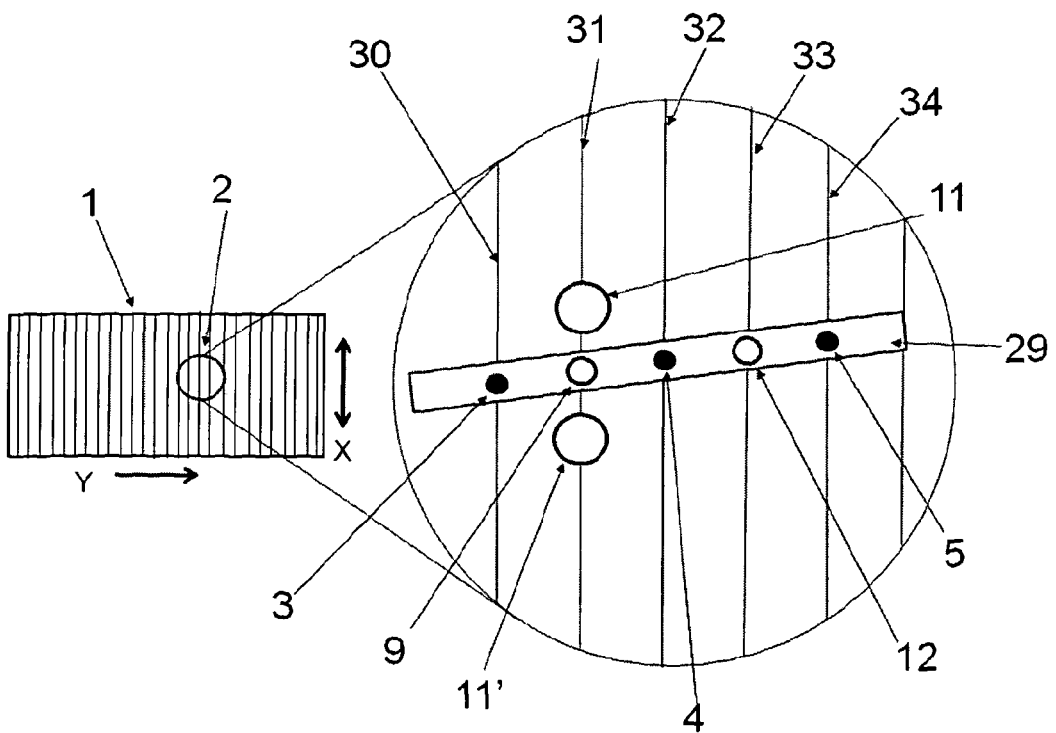

FIG. 8: This is similar to the arrangement shown in FIG. 7 except that the components on the frame on the process head are ordered in a different sequence. Many sequences of components on the head are possible as there are only a limited number of process ordering conditions that are essential to the interconnect forming process:
 1) Laser head 3 scribing groove 6 must precede insulating ink dispensing nozzle 9
 2) Insulating ink dispensing nozzle 9 must precede conducting ink dispensing nozzle 12
 3) Laser head 4 scribing groove 7 must precede conducting ink dispensing nozzle 12

In cases where curing of the insulating ink is required prior to deposition of the conducting ink, the curing device 11 must also follow insulating ink dispensing nozzle 9.

Figure 9:
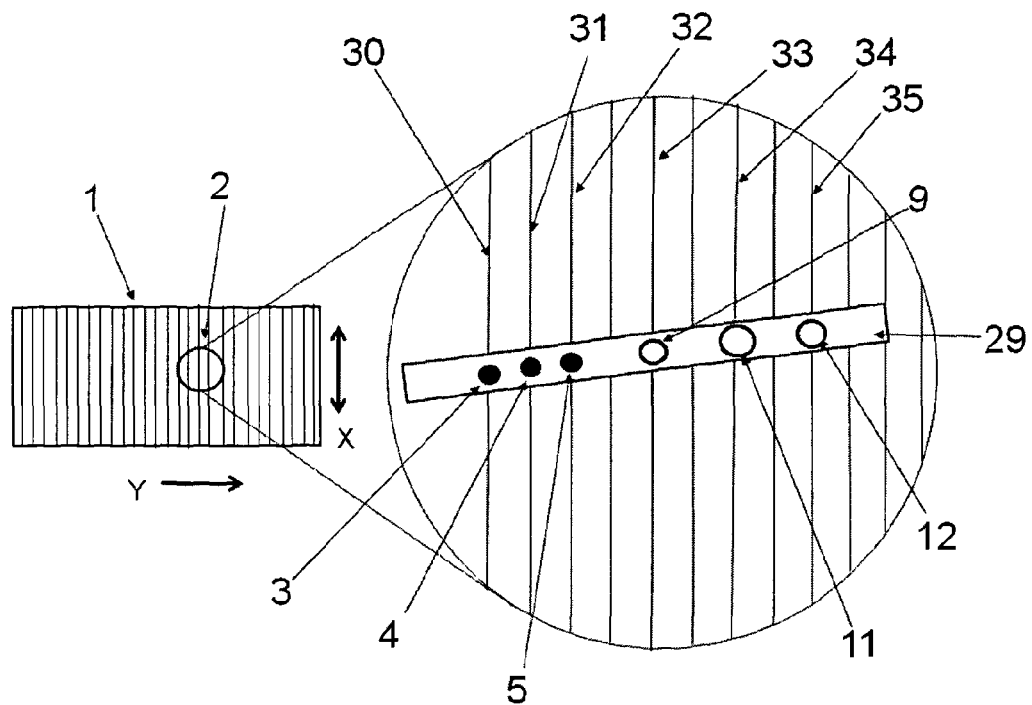

Any sequence of components on the head that meets the three conditions above is possible. In the arrangement shown in FIG. 8, each interconnect sees the following sequence of processes as the panel steps in the Y direction:
 1) Laser head 3 scribes groove 6 through all three layers
 2) Insulating ink is dispensed into groove 6 by ink nozzle 9 and is immediately cured by curing device 11 or 11'
 3) Laser head 4 scribes groove 7 through the top two layers
 4) Conducting ink is dispensed over the insulating ink and into groove 7 by ink nozzle 12
 5) Laser head 5 scribes groove 8 through the top layer FIG. 9: If the ink dispensing nozzles are large and setting them on a single cell pitch is difficult, an alternative arrangement where they are set on multiples of the pitch is possible as shown in FIG. 9. In this arrangement, laser heads 3, 4 and 5 address adjacent interconnects 30, 31 and 32 but nozzle 9, curing device 11 and nozzle 12 address interconnects 33, 34 and 35 which are separated by two cell widths.

Other component spacings are also possible so long as the distance between components is a multiple of the cell width.

Figure 10:
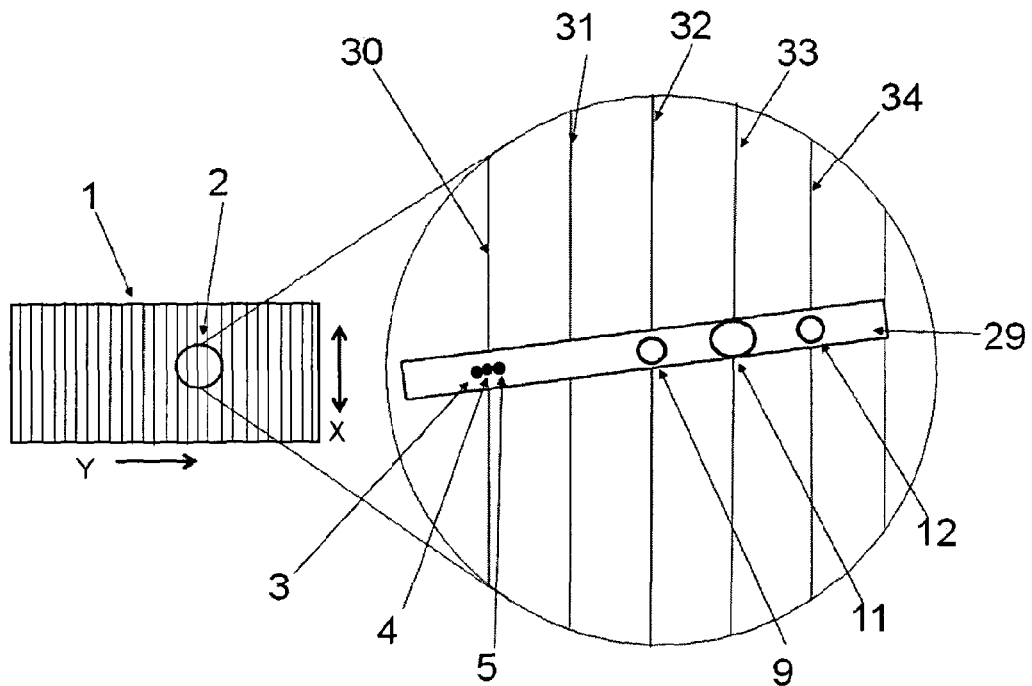

FIG. 10: In some cases it may be convenient to generate the three laser beams 3, 4 and 5 by means of a diffractive optical element (DOE) that divides a single input beam into three focal spots at the focal plane of a single lens. In this case, it is convenient to locate all three beams on a single interconnect as shown in FIG. 10.

In this case, laser beams 3, 4 and 5 all operate on interconnect 30 whereas insulating ink dispensing nozzle 9, ink curing device 11 and conducting ink dispensing device 12 operate on separate interconnects 32, 33 and 34, respectively.

Figure 11:
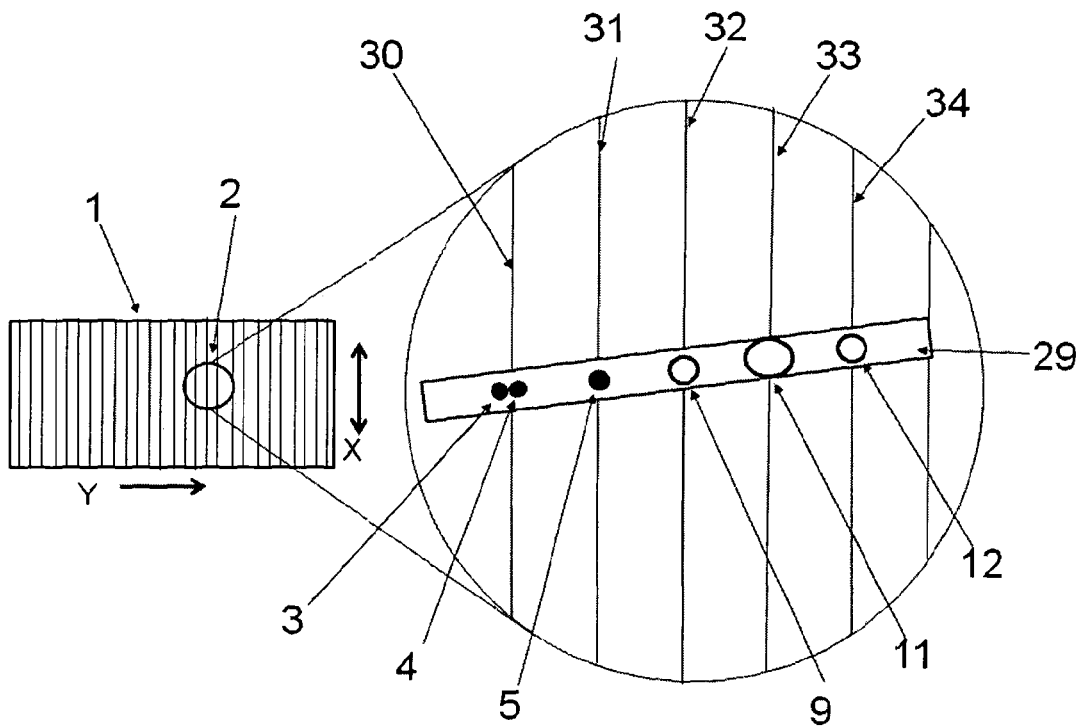

FIG. 11: Other similar arrangements where only two laser beams operate on the same interconnect and the third operates on a separate one are possible as shown in FIG. 11.

Figure 12:
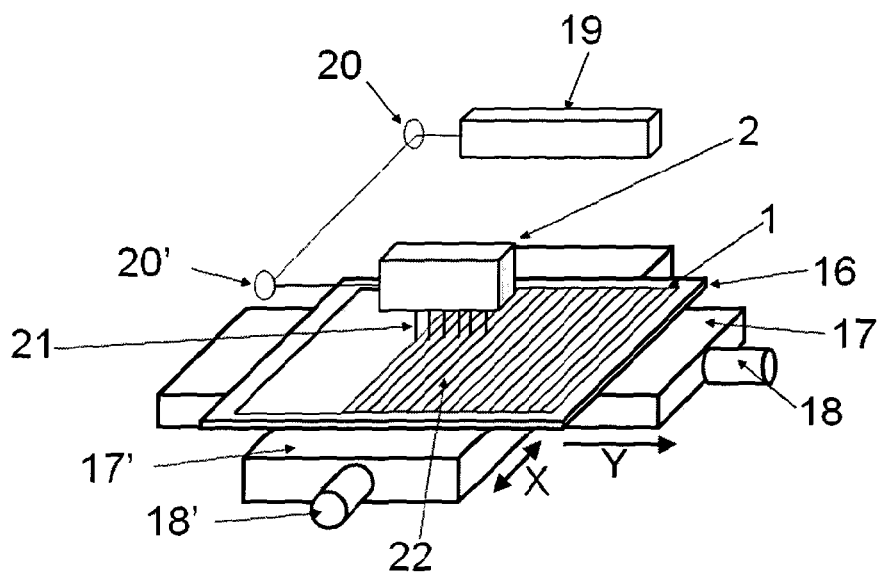
FIG. 12 shows apparatus for moving a substrate in two directions with respect to a process head such as that shown in FIGS. 4 to 11.

FIG. 12: This shows one possible arrangement for moving a process head as described in FIGS. 6 to 11 with respect to the solar panel. Panel 1 is supported on a process chuck 16 which is moved in the Y direction by linear stage 17 driven by servo-motor 18 and in the X direction by linear stage 17' driven by servo-motor 18'. The beam from laser 19 is directed by mirrors 20, 20' to process head 2 where it is divided into three components to create the three scribes 6, 7 and 8. Process head 2 also contains two ink jet nozzles and one curing device. All six components are arranged in a line 21 along the Y direction and complete the full process of forming cell interconnect structures 22 after the completion of 6 passes of the panel under the process head in the X direction and 6 cell width steps by the panel in the Y direction towards the right of the figure.

Figure 13:
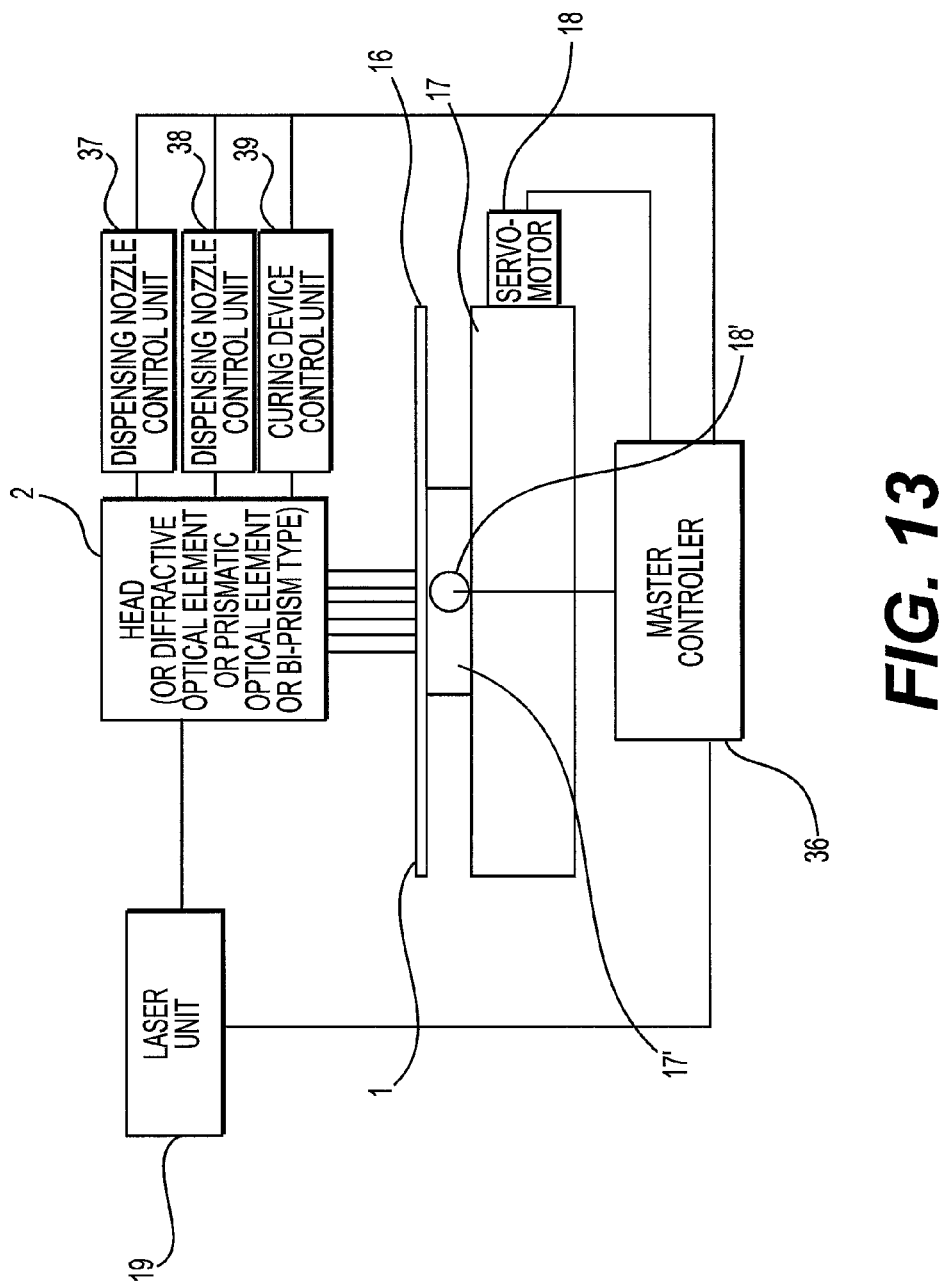
FIG. 13 shows apparatus for controlling the operation of the laser or lasers, the ink jet heads and associated motion systems.

FIG. 13: This shows a typical method for controlling the arrangement shown in FIG. 12. Panel 1, supported on process chuck 16, is moved under the process head 2 by linear stages 17, 17' driven by servo motors 18, 18' controlled by master controller unit 36. Laser unit 19 is also controlled by master controller 36 as are dispensing nozzle control units 37 and 38 and curing device control unit 39.

The invention claimed is:

1. A method for dividing a thin film device having a first layer which is a lower electrode layer, a second layer which is an active layer and a third layer which is an upper electrode layer, all the layers being continuous over the device, into separate cells which are electrically interconnected in series by interconnect structures, the dividing of the cells and the formation of interconnect structures between adjacent cells being carried out by a process head which is arranged to be able to operate on more than one interconnect at a time and to perform the following steps, in the formation of each interconnect structure, in a sequence of passes to and fro over the device:
   a) making a first cut through the first, second and third layers;
   b) making a second cut through the second and third layers, the second cut being adjacent to the first cut;
   c) making a third cut through the third layer the third cut being adjacent to the second cut and on the opposite side of the second cut to the first cut;
   d) using a first ink jet print head to deposit a non-conducting material into the first cut; and
   e) using a second ink jet print head to apply conducting material to bridge the non-conducting material in the first cut and either fully or partially fill the second cut such that an electrical connection is made between the first layer and the third layer,
   wherein, step (a) precedes step (d), step (d) precedes step (e) and step (b) precedes step (e) (otherwise the steps may be carried out in any order) and, wherein, during at least one pass of the process head over the device, at least two of said steps are carried out, each on separate interconnect structures.

2. A method as claimed in claim 1 in which the order in which the steps are carried out is determined by the relative positions on the process head of the first and second ink jet print heads and components on said process head for forming said first, second and third cuts in a direction perpendicular to the direction of movement of the head (or at an angle thereto).

3. A method as claimed in claim 1 in which one or more of the first, second and third cuts are formed using one or more laser beams.

4. A method as claimed in claim 1 in which one or more of the first, second and third cuts are formed using one or more mechanical scribers.

5. A method as claimed in claim 1 in which the process head carries out said steps in a sequence of passes in both directions across the device.

6. A method as claimed in claim 1 in which the thin film device is one of the following: a solar panel, a lighting panel and a battery.

7. A method as claimed in claim 1 in which one or more curing steps are carried out to cure said non-conducting material and/or said conducting material after deposition into the respective cut.

8. A method as claimed in claim 7 in which one or more of said curing steps are carried out in separate apparatus after said sequence of passes.

9. A method as claimed in claim 7 in which one or more of said curing steps are carried out by one or more curing devices provided on said process head as the process head passes over the device.

10. Apparatus for dividing a thin film device having a first layer which is a lower electrode layer, a second layer which is an active layer and a third layer which is an upper electrode layer, all the layers being continuous over the device, into separate cells each having a width W, which are electrically interconnected in series by interconnect structures, so that adjacent interconnect structures are spaced from each other by the distance W, the apparatus comprising a process head on which are provided:
   a) one or more cutter units for making a first cut through the first, second and third layers, a second cut through the second and third layers adjacent to the first cut and a third cut through the third layer adjacent to the second cut and on the opposite side of the second cut to the first cut;
   b) a first ink jet print head for depositing a non-conducting material into the first cut; and
   c) a second ink jet print head for applying conducting material to bridge the non-conducting material in the first cut and either fully or partially fill the second cut so that an electrical connection is made between the first layer and the third layer, said one or more cutters and said first and second ink jet heads being spaced apart from each other by the distance W (or multiples thereof) whereby the process head can operate on more than one interconnect structure at a time, the apparatus also comprising:
   d) a drive motor arranged to move the process head relative to the device; and
   e) a controller arranged to control movement of the process head relative to the device and actuating said one or more cutter units and said first and second ink jet print heads so that division of the device into separate cells and the formation of the interconnect structures can be carried out in a sequence of passes of the process head to and fro over the device.

11. Apparatus as claimed in claim 10 in which said one or more cutter units comprise pulsed lasers of two or more types for forming the first, second and/or third cuts.

12. Apparatus as claimed in claim 10 in which the process head comprises a line of five components spaced apart by the distance W (or multiples thereof): the three cutter units and the first and second ink jet print heads and also comprises first and second curing devices positioned adjacent the first or second ink jet print head one for operating during movement of the head in a first direction over the device and the other for operating during movement of the head in the opposite direction over the device.

13. Apparatus as claimed in claim 10 in which the drive motor comprises a dual axis servo motor for moving the process head relative to the device in two orthogonal directions.

14. Apparatus as claimed in claim 10 in which the control system is arranged so that the device and process head move relative to each other in a first direction parallel to the lengths of the first and second cuts in a continuous path across the device and at the end of the path to step in a direction perpendicular to the first direction by a distance W equal to the width of the cells to be formed in the device.

15. Apparatus as claimed in claim 10 in which the process head comprises a line of six components spaced apart by the distance W (or multiples thereof): the three cutter units, the first and second ink jet print heads and a curing device.

16. Apparatus as claimed in claim 15 in which the three cutter devices are spaced apart by the distance W from each other and the first and second ink jet print heads are spaced from each other by a multiple of the distance W.

17. Apparatus as claimed in claim 10 in which said one or more cutter units comprises a single pulsed laser for forming the first, second and third cuts.

18. Apparatus as claimed in claim 17 which comprises a focussing lens for delivering first, second and third laser beams to the device, there being angular deviation between the beams such that the focal spots at the focus of the lens formed by the first, second and third laser beams have the required spatial separation on the device surface for forming said first, second and third cuts.

19. Apparatus as claimed in claim 17 comprising a prismatic optical element for splitting a laser beam from a pulsed laser to form first, second and third laser beams for forming said first, second and third cuts.

20. Apparatus as claimed in claim 17 comprising a diffractive optical element for splitting a laser beam from a first pulsed laser to form any two of the first, second and third laser beams, and a second pulsed laser for providing the remaining laser beam arranged such that beams from the first and second pulsed lasers combine to form three spatially separated laser spots on the surface of the device for forming said first, second and third cuts.

21. Apparatus as claimed in claim 17 comprising a prismatic optical element of bi-prism type for splitting a laser beam from a first pulsed laser to form any two of the first, second and third laser beams, and a second pulsed laser for providing the remaining laser beam arranged such that the beams from the first and second pulsed lasers combine to form three spatially separated laser spots on the surface of the device for forming said first, second and third cuts.

22. Apparatus as claimed in claim 17 comprising a diffractive optical element for splitting a laser beam from a pulsed laser to form first, second and third laser beams for forming the first, second and third cuts.

23. Apparatus as claimed in claim 22 in which two or three of the laser beams are positioned so as to operate on the same interconnect structure and the first and second ink jet print heads are spaced from the laser beams and from each other by the distance W (or a multiple thereof).

* * * * *